US011088175B2

(12) United States Patent
Wen

(10) Patent No.: US 11,088,175 B2
(45) Date of Patent: Aug. 10, 2021

(54) DISPLAY PANEL, METHOD FOR DRIVING THE SAME, AND DISPLAY DEVICE

(71) Applicant: XIAMEN TIANMA MICRO-ELECTRONICS CO., LTD., Xiamen (CN)

(72) Inventor: Liang Wen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 72 days.

(21) Appl. No.: 15/789,508

(22) Filed: Oct. 20, 2017

(65) Prior Publication Data

US 2018/0061859 A1    Mar. 1, 2018

(30) Foreign Application Priority Data

Apr. 28, 2017    (CN) .......................... 201710296501.2

(51) Int. Cl.
*H01L 27/12*    (2006.01)
*H01L 29/786*    (2006.01)
(Continued)

(52) U.S. Cl.
CPC ......... *H01L 27/124* (2013.01); *G09G 3/2092* (2013.01); *G09G 3/3648* (2013.01); *H01L 27/1251* (2013.01); *H01L 27/1274* (2013.01); *H01L 29/42384* (2013.01); *H01L 29/78633* (2013.01); *H01L 29/78648* (2013.01); *H01L 29/78672* (2013.01); *H01L 29/78675* (2013.01);
(Continued)

(58) Field of Classification Search
CPC ............. H01L 27/124; H01L 29/78648; H01L 27/1274; H01L 29/78675; H01L 21/31116; H01L 29/78621; G09G 3/2092
See application file for complete search history.

(56) References Cited

U.S. PATENT DOCUMENTS 6,344,885 B1    2/2002 Mori et al.
6,674,136 B1 *    1/2004 Ohtani ................ G02F 1/13454
257/408
(Continued)

FOREIGN PATENT DOCUMENTS

CN    1378290 A    11/2002
CN    101414436 A    4/2009
(Continued)

*Primary Examiner* — Latanya N Crawford Eason
(74) *Attorney, Agent, or Firm* — Kilpatrick Townsend & Stockton, LLP

(57) ABSTRACT

The disclosure discloses a display panel, a method for driving the same, and a display device, where a control electrode is arranged on the side of an active layer of a thin film transistor away from a gate electrode, and the thickness of a buffer layer between the control electrode and the active layer is controlled so that the buffer layer is thicker than a gate insulation layer between the gate electrode and the active layer, to adjust the distance between the control electrode and the active layer to be larger than the distance between the gate electrode and the active layer; and at least when a gate off voltage is applied to the gate electrode so that the thin film transistor is switched off, a first control voltage is applied to the control electrode to vary a voltage Vg of the thin film transistor.

15 Claims, 14 Drawing Sheets

(51) Int. Cl.
  *H01L 29/423* (2006.01)
  *G09G 3/36* (2006.01)
  *G09G 3/20* (2006.01)
  *H01L 21/311* (2006.01)

(52) U.S. Cl.
  CPC ... *G09G 3/3688* (2013.01); *G09G 2300/0417* (2013.01); *G09G 2310/0291* (2013.01); *G09G 2310/0297* (2013.01); *G09G 2320/0214* (2013.01); *G09G 2330/023* (2013.01); *H01L 21/31116* (2013.01); *H01L 29/78621* (2013.01); *H01L 2029/42388* (2013.01)

(56) References Cited

U.S. PATENT DOCUMENTS

| | | | |
|---|---|---|---|
| 8,987,047 B2 | 3/2015 | Lee et al. | |
| 9,135,857 B2 | 9/2015 | Iida et al. | |
| 9,291,870 B2* | 3/2016 | Shin | H01L 23/3677 |
| 9,373,724 B2* | 6/2016 | Shimizu | H01L 29/78606 |
| 2001/0030323 A1* | 10/2001 | Ikeda | H01L 29/78648 257/59 |
| 2006/0166415 A1 | 7/2006 | Afentakis et al. | |
| 2011/0175674 A1* | 7/2011 | Shimizu | H01L 29/78606 327/537 |
| 2014/0160385 A1 | 6/2014 | Yamazaki et al. | |
| 2015/0123081 A1* | 5/2015 | Huang | H01L 27/3279 257/40 |
| 2015/0311232 A1* | 10/2015 | Sun | G02F 1/136227 257/72 |
| 2016/0276376 A1* | 9/2016 | Sun | H01L 27/124 |
| 2016/0351595 A1* | 12/2016 | Dai | G02F 1/133512 |
| 2017/0062545 A1* | 3/2017 | Oh | H01L 27/3276 |
| 2018/0040632 A1* | 2/2018 | Zhang | G02F 1/136209 |
| 2018/0175077 A1* | 6/2018 | Koo | H01L 27/3272 |
| 2019/0004660 A1* | 1/2019 | Guo | G06F 3/0414 |

FOREIGN PATENT DOCUMENTS

| | | |
|---|---|---|
| CN | 104503177 A | 4/2015 |
| CN | 104952404 A | 9/2015 |
| CN | 106158882 A | 11/2016 |

\* cited by examiner

DISPLAY PANEL, METHOD FOR DRIVING THE SAME, AND DISPLAY DEVICE

CROSS-REFERENCE TO RELATED APPLICATIONS

This application claims the priority to Chinese Patent Application No. 201710296501.2, filed on Apr. 28, 2017, the content of which is hereby incorporated by reference in its entirety.

FIELD

The present disclosure relates to the field of display technologies, and particularly to a display panel, a method for driving the same, and a display device.

BACKGROUND

At present, with the development of sciences and technologies, thin film transistors in display modules such as liquid crystal display panels are made of low-temperature poly-silicon, and, FIG. 1 illustrates an array substrate including a low-temperature poly-silicon thin film transistor, where the array substrate generally includes a light-shielding layer 001, a buffer layer 002, a poly-silicon layer (i.e., an active layer) 003, a gate insulation layer 004, a gate electrode 005, an interlayer insulation layer 006, source and drain electrodes 007, a planarization layer 008, a first transparent electrode 009, a passivation layer 010, and a second transparent electrode 011 arranged on an underlying substrate in that order, where the first transparent electrode 009 works as a common electrode, and the second transparent electrode 011, working as a pixel electrode, is connected with the source electrode of the source and drain electrodes 007 through a via hole running through the planarization layer 008 and the passivation layer 010.

If a circuit structure, e.g., an inverter including an NTFT and a PTFT as illustrated in FIG. 2, consists of thin film transistors structured as illustrated in FIG. 1, then current-voltage (Id-Vg) curves thereof may be as illustrated in FIG. 3, where threshold voltages Vth of the NTFT and the PTFT are approximate, with Vth of the NTFT being typically approximately 0.6V, and Vth of the PTFT being typically approximately −0.6V, so that there is a large leakage current Id, typically approximately $10^{-7}$ A to $10^{-9}$ A, at voltage Vg=0 of the gate electrode. The large leakage current in the circuit consisting of a NTFT and a PTFT with a large leakage current may have problems such as high power consumption and instability of the device.

In view of this, how to lower the leakage current in a thin film transistor is a technical problem highly desirable to be addressed in the related art.

SUMMARY

Embodiments of the disclosure provide a display panel, a method for driving the same, and a display device so as to address the problem of a large leakage current in the thin film transistor in the related art.

In an aspect, an embodiment of the disclosure provides a display panel, the display panel including thin film transistors, wherein each of the thin film transistors includes an active layer, a gate electrode, a control electrode, a gate insulation layer arranged between the gate electrode and the active layer, and a buffer layer arranged between the control electrode and the active layer; where the buffer layer is thicker than the gate insulation layer; and a first control voltage is applied to the control electrode at least when a gate off voltage is applied to the gate electrode.

In another aspect, an embodiment of the disclosure provides a display device, the display device including a display panel, where the display panel includes thin film transistors and each of the thin film transistors includes an active layer, a gate electrode, a control electrode, a gate insulation layer arranged between the gate electrode and the active layer, and a buffer layer arranged between the control electrode and the active layer; where the buffer layer is thicker than the gate insulation layer; and a first control voltage is applied to the control electrode at least when a gate off voltage is applied to the gate electrode.

In another aspect, an embodiment of the disclosure provides a method for driving a display panel, applicable to driving a display panel including thin film transistors, where each of the thin film transistors includes an active layer, a gate electrode, a control electrode, a gate insulation layer arranged between the gate electrode and the active layer, and a buffer layer arranged between the control electrode and the active layer; where the buffer layer is thicker than the gate insulation layer; and a first control voltage is applied to the control electrode at least when a gate off voltage is applied to the gate electrode, the method including: applying the first control voltage to the control electrode while the stop voltage is being applied to the gate electrode of the thin film transistor.

DETAILED DESCRIPTION OF THE EMBODIMENTS

Figure 1:
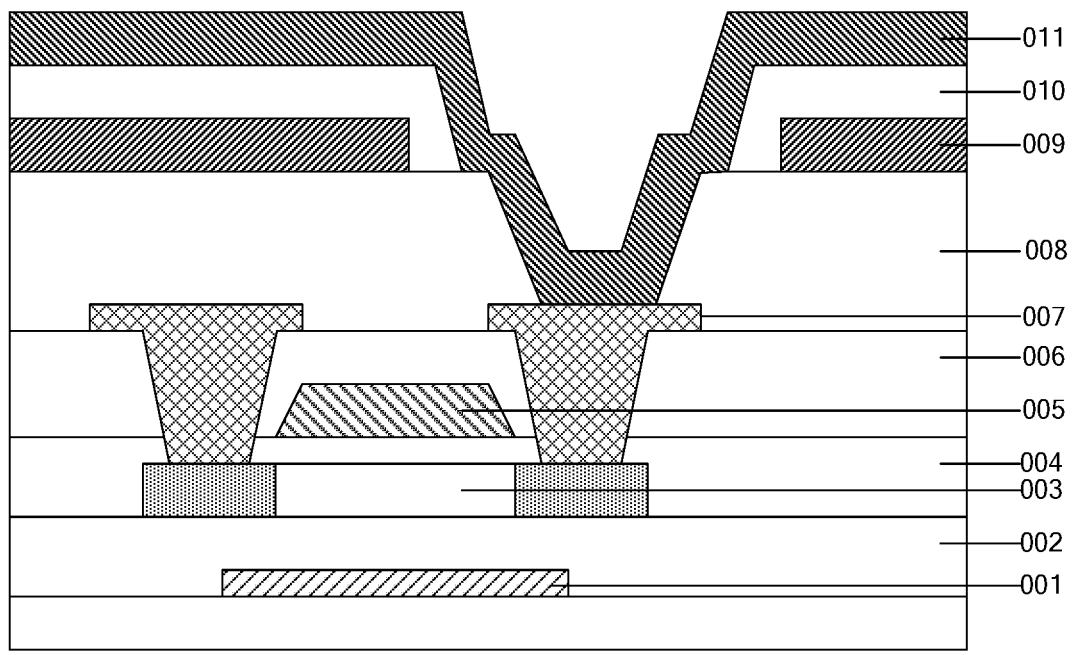
FIG. 1 is a schematic structural diagram of an array substrate in the related art.
Figure 2:
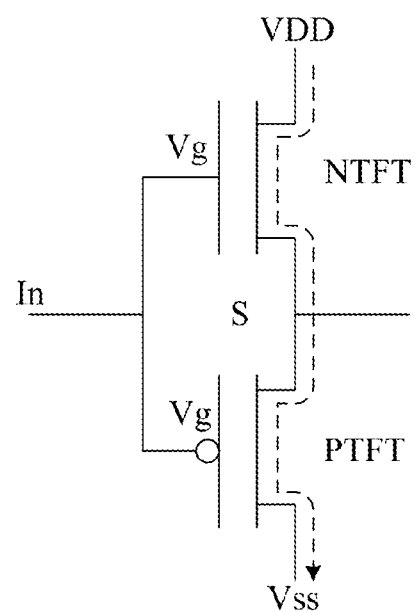
FIG. 2 is a schematic circuit diagram of an inverter in the related art.
Figure 3:
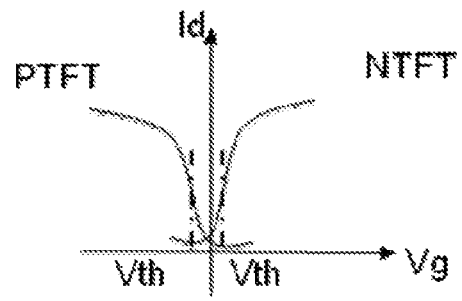
FIG. 3 is an Id-Vg curve relationship diagram of the inverter as illustrated in FIG. 2.

An array substrate, a method for driving the same, a display panel, and a display device according to embodiments of the disclosure may be described below in details with reference to the drawings.

The thicknesses of each film layer and the size of each area in the drawings are not intended to reflect a real proportion of the array substrate, but only intended to illustrate the contents of the disclosure.

Figure 4A:
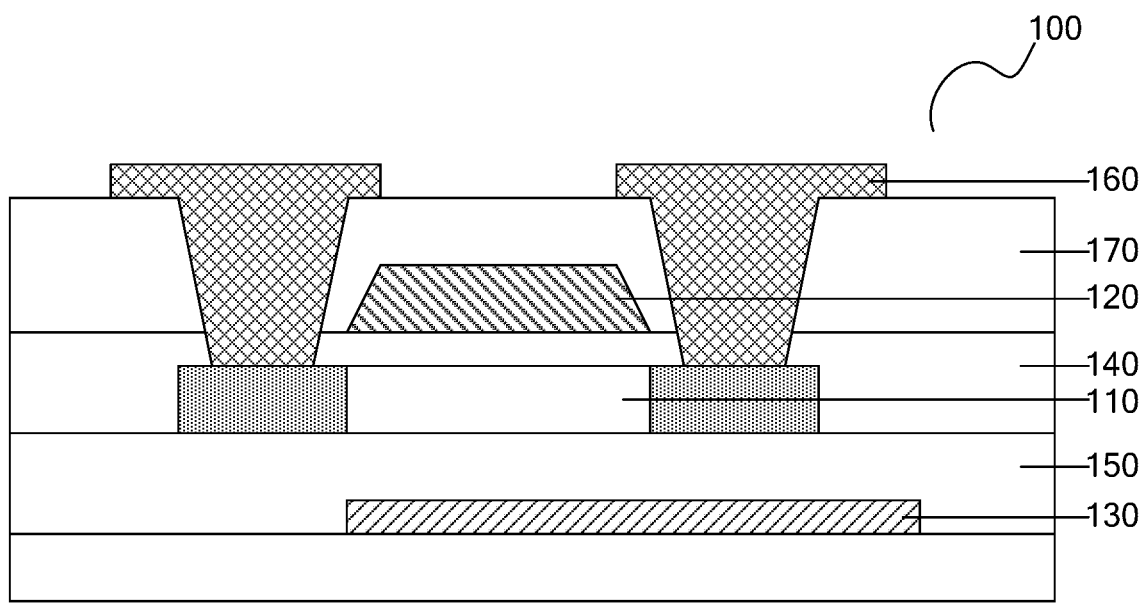
FIG. 4A and FIG. 4B are schematic structural diagrams of two array substrates, respectively, according to embodiments of the disclosure.
Figure 4B:
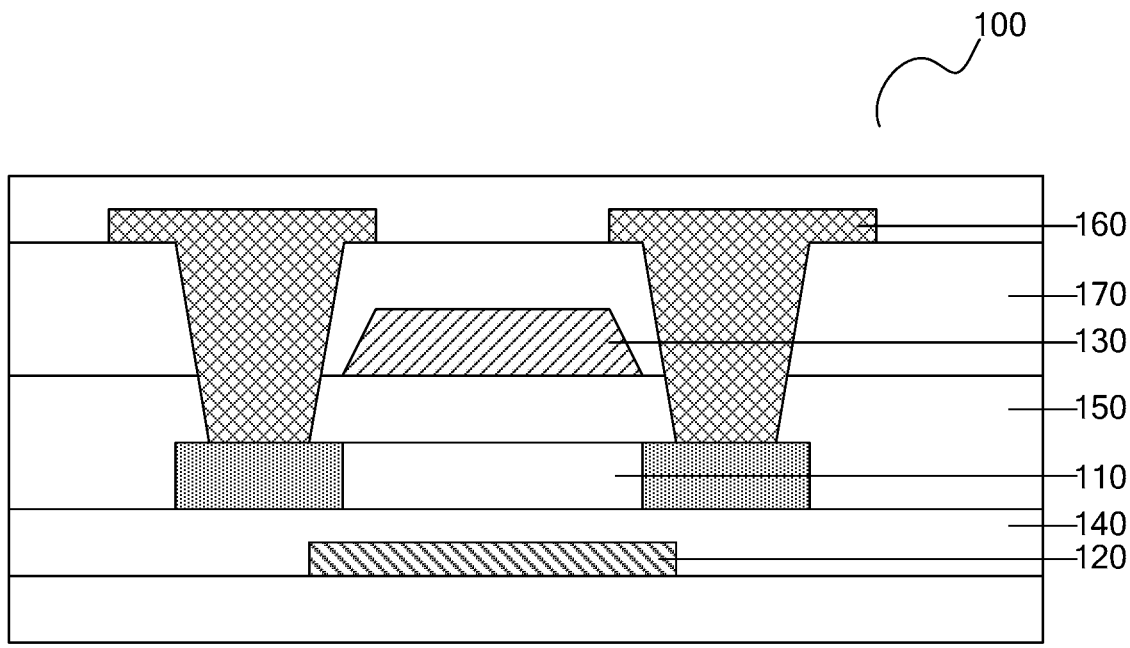

As illustrated in FIG. 4A and FIG. 4B, an array substrate according to an embodiment of the disclosure includes a thin film transistor 100, which includes an active layer 110, a gate electrode 120, a control electrode 130, a gate insulation layer 140 between the gate electrode 120 and the active layer 110, and a buffer 150 between the control electrode 130 and the active layer 110, where: the buffer layer 150 is thicker than the gate insulation layer 140; and a first control voltage is applied to the control electrode 130 at least when a gate off voltage is applied to the gate electrode 120.

In the abovementioned array substrate according to the embodiment of the disclosure, the control electrode 130 is arranged on the side of the active layer 110 of the thin film transistor 100 away from the gate electrode 120, and the thickness of the buffer layer 150 between the control electrode 130 and the active layer 110 is controlled so that the buffer layer 150 is thicker than the gate insulation layer 140 between the gate electrode 120 and the active layer 110, to adjust the distance between the control electrode 130 and the active layer 110 to be larger than the distance between the gate electrode 120 and the active layer 110, so that when the first control voltage at any potential is applied to the control electrode 130, the thin film transistor 100 cannot be controlled directly to be switched on or off, therefore, the control electrode 130 cannot be equivalent to another gate electrode 120 added to the thin film transistor, that is, the control electrode 130 cannot control the thin film transistor 100 to be switched on or off, but can only vary threshold voltage Vth of the thin film transistor 100; and at least when the gate off voltage is applied to the gate electrode 120 so that the thin film transistor 100 is switched off, the first control voltage is applied to the control electrode 130 to vary voltage Vg of the thin film transistor 100 so as to vary the threshold voltage Vth of the thin film transistor 100 so that an Id-Vg curve of the thin film transistor 100 is shifted to ensure a small leakage current Id when the thin film transistor is switched off, for the effect of stabilizing the circuit and lowering power consumption thereof.

In one implementation, in the abovementioned array substrate according to the embodiment of the disclosure, the thickness of the buffer layer 150 typically ranges from 1000 nm to 5000 nm, and in practice the thickness of the buffer layer 150 is typically approximately 3000 nm. The thickness of the gate insulation layer 140 typically ranges from 50 nm to 200 nm, and in practice the thickness of the gate insulation layer 140 is typically approximately 120 nm.

Moreover, in one implementation, in the abovementioned array substrate according to the embodiment of the disclosure, when a gate on voltage is applied to the gate electrode 120 so that the thin film transistor 100 is switched on, a second control voltage can be also applied to the control electrode 130 to vary the threshold voltage Vth of the thin film transistor 100 for the effect of stabilizing the circuit.

In one implementation, in the abovementioned array substrate according to the embodiment of the disclosure, the gate on voltage and the gate off voltage applied to the gate electrode 120 varies with a varying type of the thin film transistor 100. For example, if the thin film transistor is an N-type Thin Film Transistor (NTFT), then the gate on voltage applied to the gate electrode 120 may typically be 10V so that the NTFT is switched on, and the gate off voltage applied to the gate electrode 120 may typically be −7V so that the NTFT is switched off. If the thin film transistor is a P-type Thin Film Transistor (PTFT), then the gate on voltage applied to the gate electrode 120 may typically be -10V so that the NTFT is switched on, and the gate off voltage applied to the gate electrode 120 may typically be 7V so that the NTFT is switched off.

In one implementation, in the abovementioned array substrate according to the embodiment of the disclosure, the first control voltage and/or the second control voltage applied to the control electrode 130 of the thin film transistor typically lies between the gate on voltage and the gate off voltage. If the thin film transistor is an N-type thin film transistor, the potentials of the first control voltage and the second control voltage may typically range from −7V to 10V. If the thin film transistor is a P-type thin film transistor, the potentials of the first control voltage and the second control voltage may typically range from −10V to 7V. In this way, the potential(s) of the first control voltage and/or the second control voltage can be controlled to lie between the gate on voltage and the gate off voltage to enable an external powering circuit to generate the required potentials of the first control voltage and the second control voltage from existing generated potentials in a real operating process.

Moreover in one implementation, in the abovementioned array substrate according to the embodiment of the disclosure, the potentials of the first control voltage and the second control voltage applied to the control electrode 130 may be the same so that there is a same threshold voltage Vth of the thin film transistor when it is switched on and off; or the potentials of the first control voltage and the second control voltage applied to the control electrode 130 may be different so that there are different threshold voltages Vth of the thin film transistor when it is switched on and off. The potentials of the first control voltage and the second voltage can be adjusted as needed in practice although the embodiment of the disclosure may not be limited thereto.

Figure 5A:
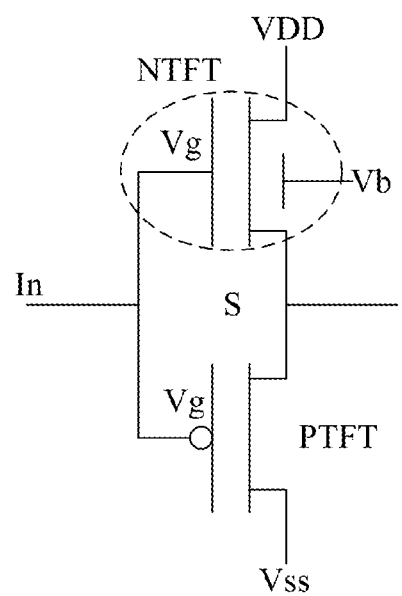
FIG. 5A and FIG. 5B are schematic circuit diagrams of two inverters, respectively, according to embodiments of the disclosure.
Figure 6A:
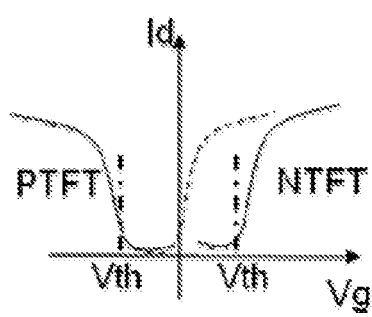
FIG. 6A to FIG. 6C are three Id-Vg curve relationship diagrams, respectively, according to embodiments of the disclosure.

In one embodiment, the abovementioned array substrate according to the embodiment of the disclosure, if the thin film transistor is an N-type thin film transistor, the first control voltage may range from −1.5V to 0V with −1.5 V and 0 V included. In one embodiment, taking the inverter as illustrated in FIG. 5A as an example, the control electrode 130 may be arranged only in the NTFT, and the first control voltage and the second voltage of the control electrode 130 can be adjusted to be Vb to vary the voltage Vg of the gate electrode 120, so as to vary the threshold voltage Vth of the NTFT for the effect of stabilizing the circuit. In one embodiment, in the Id-Vg curves as illustrated in FIG. 6A, the PTFT with the threshold voltage Vth of −1.5V, and the NTFT with the threshold voltage Vth of 0V (denoted by the dotted line) may be fabricated. Thereafter the first control voltage and the second control voltage with Vb of −1.5V are applied to the control electrode 130 of the NTFT so that the threshold voltage Vth of the NTFT is adjusted from 0V to 1.5V (denoted by the solid line). In this way there may be such a long distance between the curves of the NTFT and the PTFT that there is a small leakage current of approximately $10^{-12}$ A to $10^{-13}$ A at Vg=0 to lower power consumption and stabilize the circuit. The Id-Vg curves have been compared above by way of an example in which the first control voltage and the second control voltage are −1.5V, but as can be apparent from the experiments, there may be a similar effect to the Id-Vg curves as illustrated in FIG. 6A as long as the values of the first control voltage and the second control voltage range from −1.5V to 0V with −1.5 V and 0 V included, so a repeated description thereof may be omitted here.

Figure 5B:
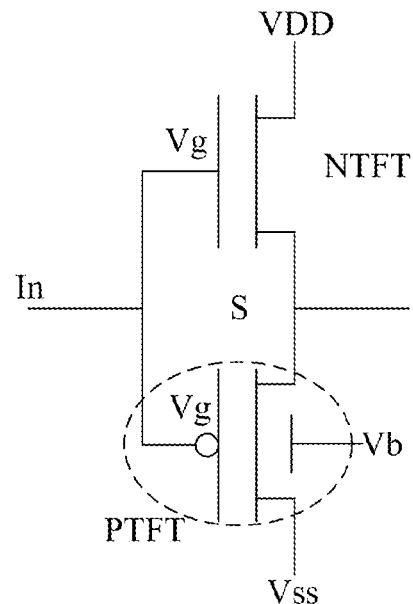
Figure 6B:
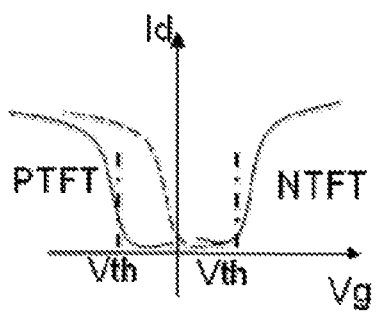

In one embodiment, the abovementioned array substrate according to the embodiment of the disclosure, if the thin film transistor is a P-type thin film transistor, then the first control voltage may range from 0V to 1.5V with 0 V and 1.5 V included. In one embodiment, taking the inverter as illustrated in FIG. 5B as an example, the control electrode 130 may be arranged only in the PTFT, and the first control voltage and the second voltage of the control electrode 130 can be adjusted to be Vb to vary the voltage Vg of the gate electrode 120 so as to vary the threshold voltage Vth of the PTFT for the effect of stabilizing the circuit. In one embodiment, the Id-Vg curves as illustrated in FIG. 6B, the NTFT with the threshold voltage Vth of 1.5V, and the PTFT with the threshold voltage Vth of 0V (denoted by the dotted line) may be fabricated. Thereafter the first control voltage and the second control voltage with Vb of 1.5V are applied to the control electrode 130 of the PTFT so that the threshold voltage Vth of the PTFT is adjusted from 0V to −1.5V (denoted by the solid line). In this way there may be such a long distance between the curves of the NTFT and the PTFT that there is a small leakage current of approximately $10^{-12}$ A to $10^{-13}$ A at Vg=0 to lower power consumption and stabilize the circuit. The Id-Vg curves have been compared above by way of an example in which the first control voltage and the second control voltage are 1.5V, but as can be apparent from the experiments, there may a similar effect to the Id-Vg curves as illustrated in FIG. 6B as long as the values of the first control voltage and the second control voltage range from 0V to 1.5V with 0 V and 1.5 V included, so a repeated description thereof may be omitted here.

Figure 7:
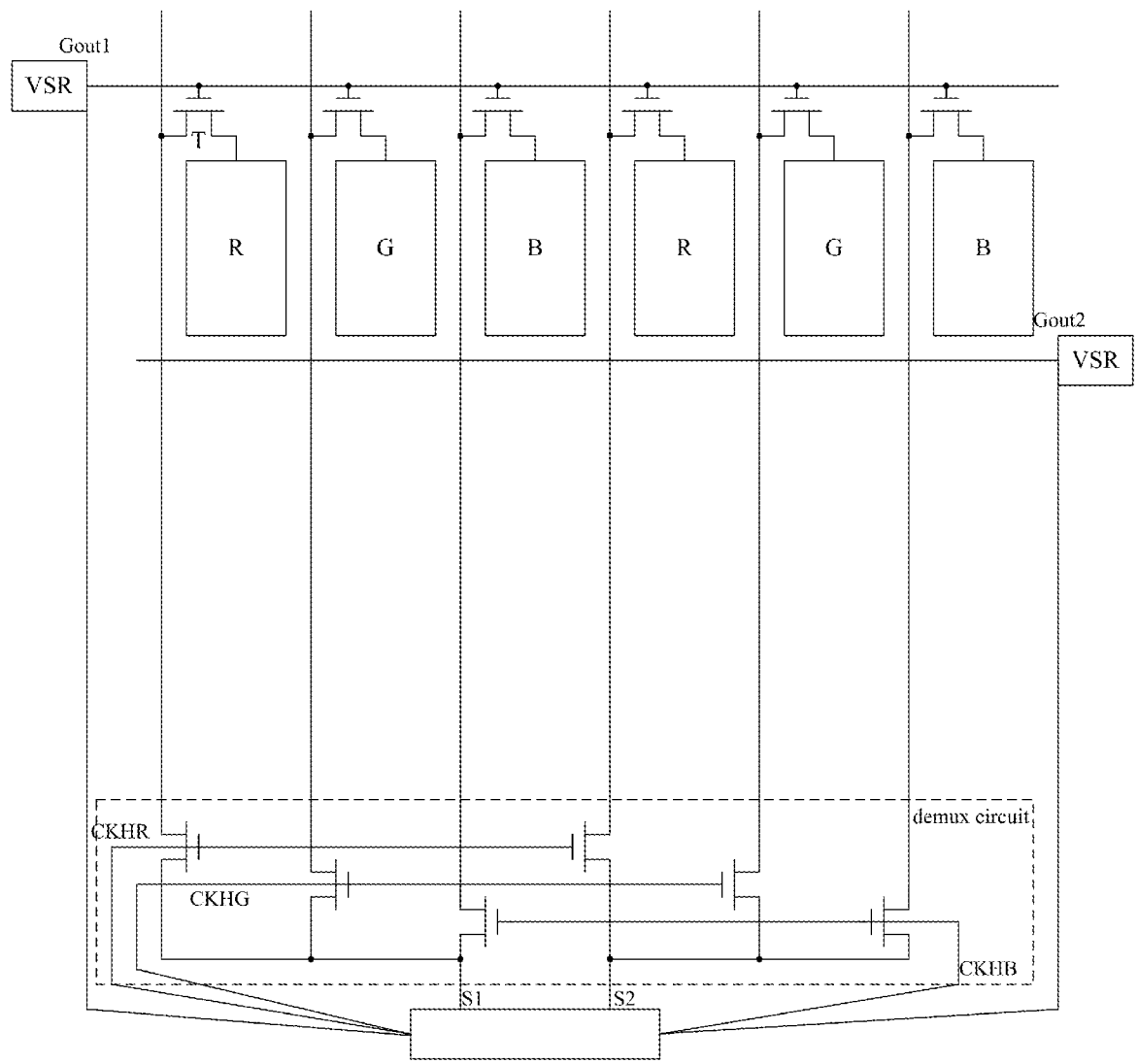
FIG. 7 is a schematic circuit diagram of an array substrate according to an embodiment of the disclosure.
Figure 8:
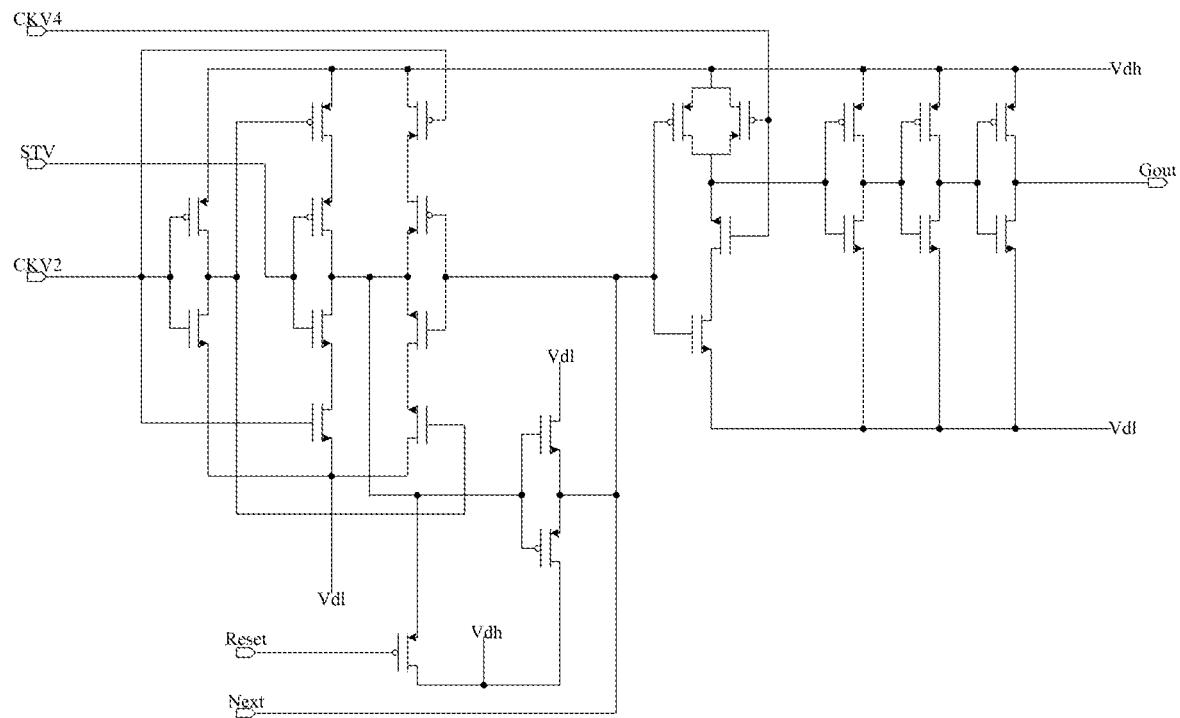
FIG. 8 is a schematic circuit diagram of a VSR in an array substrate according to an embodiment of the disclosure.

In one implementation, in the abovementioned array substrate according to the embodiment of the disclosure, as illustrated in FIG. 7, the array substrate generally includes a display area and a non-display area, where a plurality of pixel elements are arrayed in the display area, and a pixel control transistor T is typically arranged in each pixel element; and typically driver circuits are arranged in the non-display area, and can include a gate driver circuit VSR and a data driver circuit. Here the gate driver circuit VSR is structured as illustrated in FIG. 8, for example, and typically consists of N-type transistors and P-type transistors, and a demux circuit in the data driver circuit typically consists of N-type transistors. The pixel control transistors in the display area may be N-type transistors as illustrated in FIG. 7, or may be P-type transistors, although the embodiment of the disclosure may not be limited thereto. As can be apparent from the description above, both N-type transistors and P-type transistors may exist in the abovementioned array substrate according to the embodiment of the disclosure. Of course, only P-type transistors or N-type transistors may exist in the abovementioned array substrate according to the embodiment of the disclosure although the embodiment of the disclosure may not be limited thereto.

Figure 6C:
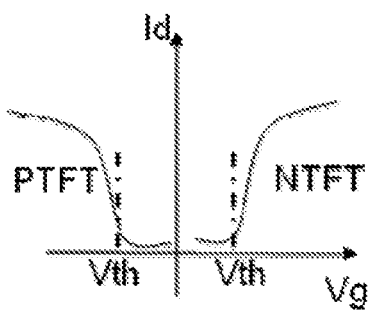

Hereupon in one implementation, in the abovementioned array substrate according to the embodiment of the disclosure, the thin film transistors 100 in which the control electrodes 130 are arranged as described above can include one or a combination of a plurality of pixel control transistors T arranged in the display area, and N-type transistors and P-type transistors in the driver circuits arranged in the non-display area. In practice, the control electrodes 130 may be arranged only for the plurality of pixel control transistors in the display area to adjust the threshold voltage; or the control electrodes 130 may be arranged only for N-type transistors in the driver circuits arranged in the non-display area to adjust the threshold voltage; or the control electrodes 130 may be arranged only for P-type transistors in the driver circuits arranged in the non-display area to adjust the threshold voltage; or the control electrodes 130 may be arranged for the plurality of pixel control transistors in the display area, and the N-type transistors and the P-type transistors in the driver circuits arranged in the non-display area, i.e., all the thin film transistors 100 in the array substrate, and then the Id-Vg curves can be attained as the ideal curves as illustrated in FIG. 6C, where if the thin film transistors are switched off, there may be a small leakage current Id which can be controlled to approximately range from $10^{-12}$ A to $10^{-13}$ A to lower power consumption effectively and stabilize the circuit.

An example in which the control electrodes 130 are arranged for all the thin film transistors 100 in the array substrate may be described below.

In one implementation, in the abovementioned array substrate according to the embodiment of the disclosure, if a pixel control transistor is an N-type transistor, then the first control voltage applied to the pixel control transistor when the gate off voltage is applied to the gate electrode 120 of the pixel control transistor may be the same as the first control voltage applied to an N-type transistor in the driver circuits when the gate off voltage is applied to the gate electrode 120 of the N-type transistor in the driver circuits, that is, when the gate off voltage is applied to the gate electrodes 120 so that all the N-type transistors in the array substrate are switched off, then a same first control voltage, e.g., Vb=−1.5V may be applied to their control electrodes 130 to control the threshold voltage Vth of all the N-type transistors to be approximately 1.5V so that there may be a small leakage current approximately ranging from $10^{-12}$ A to $10^{-13}$ A in the thin film transistors to lower power consumption and stabilize the circuit.

In one implementation, in the abovementioned array substrate according to the embodiment of the disclosure, if a pixel control transistor is an N-type transistor, the potential of the second control voltage of the pixel control transistor may be different from the potential of the second control voltage of an N-type transistor in the driver circuit. In one embodiment, the second control voltage applied to the pixel control transistor when the gate on voltage is applied to the gate electrode of the pixel control transistor may be 0V to enhance a charging current in the display area, and the second control voltage applied to the N-type transistor in the driver circuits when the gate on voltage is applied to the gate electrode of the N-type transistor may be −1.5V so that there may be a high threshold voltage Vth of the NTFT in the non-display area to improve the driving capacity of the NTFT.

In one implementation, in the abovementioned array substrate according to the embodiment of the disclosure, the thin film transistors may not be limited to any particular type thereof, but may be embodied as top-gate thin film transistors or bottom-gate thin film transistors in practice. For example, if they each are embodied as a bottom-gate thin film transistor, then as illustrated in FIG. 4B, each thin film transistor may include the gate electrode 120, the gate insulation layer 140, the active layer 110, the buffer layer 150, and the control electrode 130 arranged in that order. In another example, if they each are embodied as a top-gate thin film transistor, then as illustrated in FIG. 4A, each thin film transistor may include the control electrode 130, the buffer layer 150, the active layer 110, the gate insulation layer 140, and the gate electrode 120 arranged in that order.

As illustrated in FIG. 4A, a top-gate thin film transistor typically further includes: source and drain electrodes 160, and an interlayer insulation layer 170 arranged between the source and drain electrodes 160 and the gate electrode 120, that is, the interlayer insulation layer 170 and the source and drain electrodes 160 arranged on the gate electrode 120 in that order. Similarly, as illustrated in FIG. 4B, the bottom-gate thin film transistor also further includes: the source and drain electrodes 160, and the interlayer insulation layer 170 arranged between the source and drain electrodes 160 and the control electrode 130, that is, the interlayer insulation layer 170 and the source and drain electrodes 160 arranged on the control electrode 130 in that order.

In practice, typically a light-shielding layer in the top-gate thin film transistor is also used as the control electrode 130 to perform the functions thereof. A method for fabricating a top-gate thin film transistor in the abovementioned array substrate according to the embodiment of the disclosure may be described below taking the top-gate thin film transistor as illustrated in FIG. 4A, and the inverter as illustrated in FIG. 5B as an example, where the top-gate thin film transistor can be made of low-temperature poly-silicon, and the fabricating method is as follows.

Figure 9A:
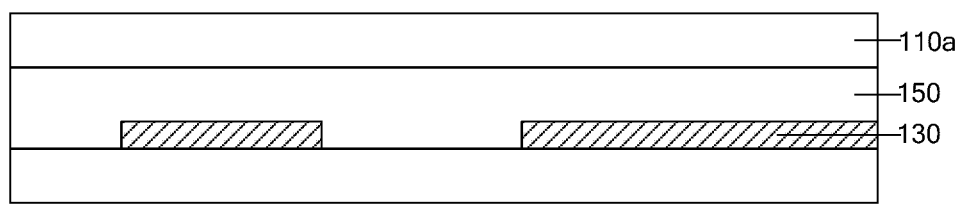
FIG. 9A to FIG. 9F are schematic structural diagrams of an array substrate in a fabrication process, respectively, according to an embodiment of the disclosure.

The step S1 is to fabricate a metal light-shielding layer on the underlying substrate, to form a light-shielding layer in the NTFT area, and to form the pattern of the control electrode 130 in the PTFT area; and thereafter, to fabricate the buffer layer 150, and to form an amorphous silicon layer on the buffer layer 150 by using traditional Plasma Enhanced Chemical Vapor Deposition (PECVD), and next to convert the amorphous silicon layer into a poly-silicon layer 110a through laser crystallization, as illustrated in FIG. 9A.

Figure 9B:
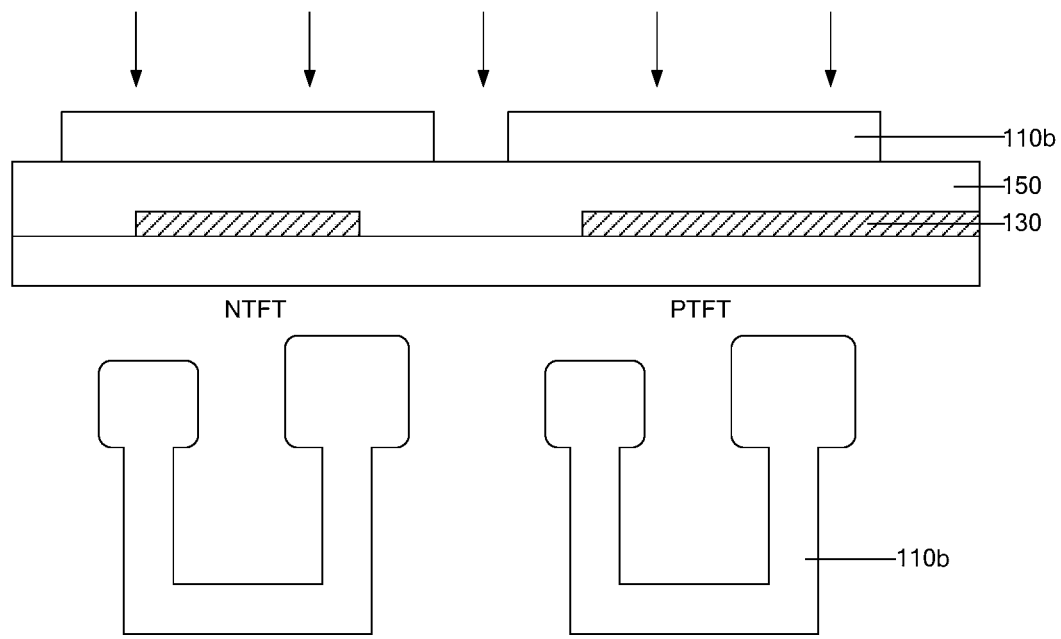

The step S2 is to pattern the poly-silicon layer 110a into poly-silicon islands 110b of the NTFT and the PTFT, and thereafter to dope the poly-silicon islands 110b with boron ions to adjust doping conditions of channels of the NTFT and the PTFT, as illustrated in FIG. 9B.

Figure 9C:
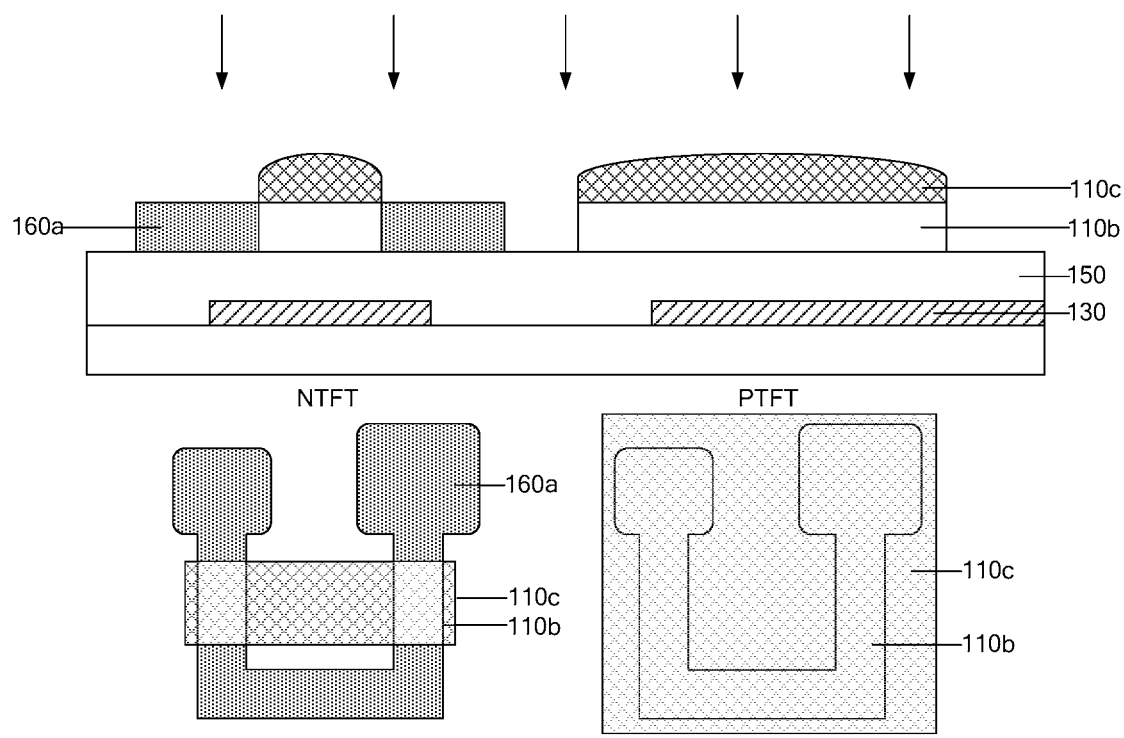

The step S3 is to fabricate a first photo-resist pattern 110c to shield the N-type channel of the NTFT and the PTFT, and to heavily dope the poly-silicon islands 110b with phosphor ions while being shielded by the first photo-resist pattern 110c to fabricate an N-type heavily doped area 160a of the source and drain electrodes of the NTFT, as illustrated in FIG. 9C.

Figure 9D:
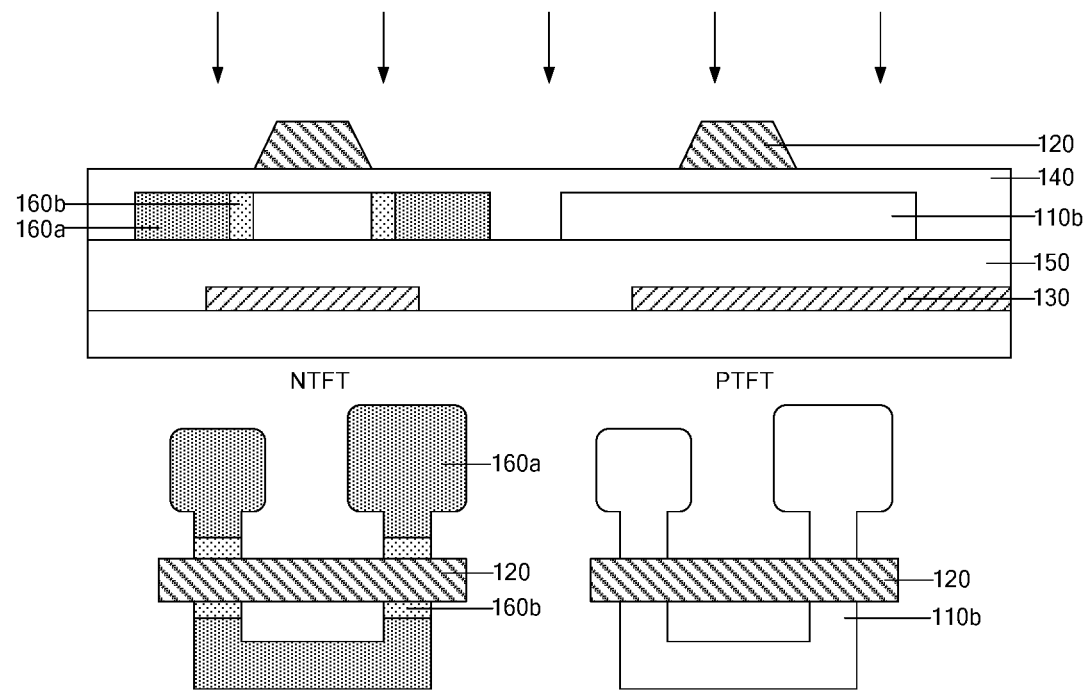

The step S4 is to form the gate insulation layer 140 and the gate electrode 120 in that order, and to lightly dope the poly-silicon islands 110b with phosphor ions while being shielded by the gate electrode 120 to form a lightly doped buffer area 160b between the channel area 110b and the N-type heavily doped area 160a of the NTFT area, as illustrated in FIG. 9D.

Figure 9E:
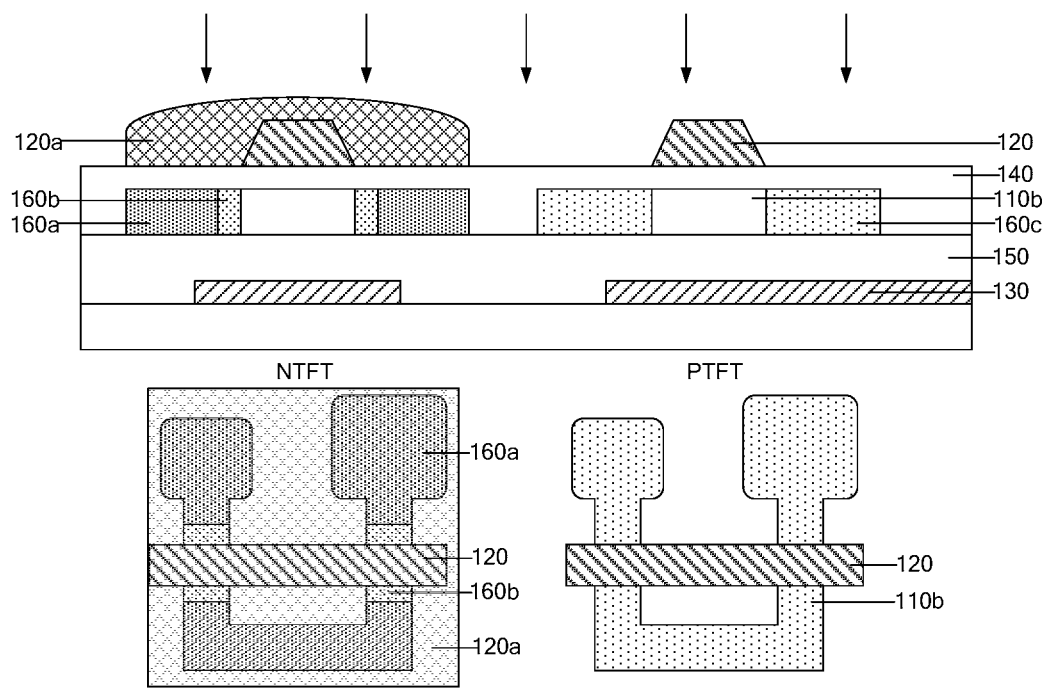

The step S5 is to fabricate a second photo-resist pattern 120a to shield the NTFT, and to dope the poly-silicon islands 110b with born ions to fabricate a P-type heavily doped area 160c of the PTFT, as illustrated in FIG. 9E.

Figure 9F:
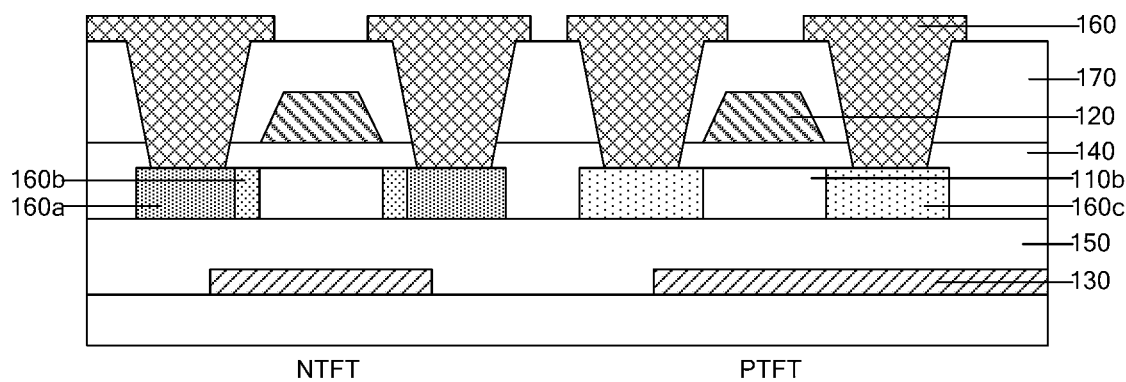

The step S6 is to fabricate the interlayer insulation layer 170 and the source and drain electrodes 160, as illustrated in FIG. 9F.

Other films possibly existed in the array substrate may be described below taking a top-gate thin film transistor as an example.

In one implementation, since the control electrode 130 of the top-gate thin film transistor is located at the bottommost one of all the film layers, i.e., the film layer closest to the underlying substrate, in order to apply the first control voltage or the second control voltage to the control electrode 130 in the thin film transistor 100 at different instances of time, in the abovementioned array substrate according to the embodiment of the disclosure, typically a signal wire connected with the control electrode 130 needs to be arranged. The signal wire may be arranged at various layers of the film layers, where an additional signal wire film layer may be added to the exiting film layers of the array substrate, or the pattern of the signal wire may be arranged in one of the exiting film layers in the array substrate to perform the functions of the signal wires without any additional film layer and preparation process thereof.

Figure 10A:
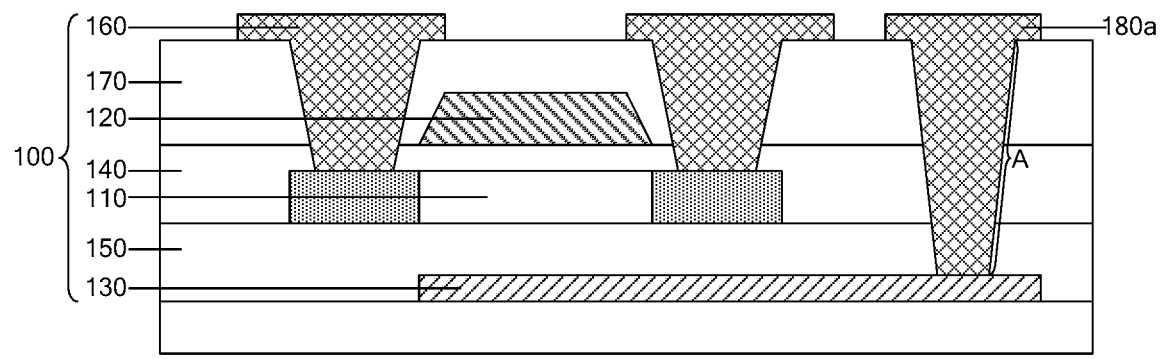
FIG. 10A to FIG. 10D are schematic structural diagrams of four other array substrates, respectively, according to embodiments of the disclosure.

In one implementation, in the abovementioned array substrate according to the embodiment of the disclosure, FIG. 10A illustrates a first implementation of the signal wire, where the array substrate can include: a first signal wire 180a arranged at the same layer as the source and drain electrodes 160, that is, the first signal wire 180a is formed at the film layer where the source and drain electrodes 160 are located. In order to avoid crosstalk between signals, the first signal wire 180a and the source and drain electrodes 160 may be arranged separately, that is, they may not be connected; and then, in order to connect the first signal wire 180a with the control electrode 130, the first signal wire 180a needs to be connected with the control electrode 130 through a first contact hole A running through the buffer layer 150, the gate insulation layer 140, and the interlayer insulation layer 170.

In one embodiment, the first signal wire 180a can be fabricated as follows.

Figure 11A:
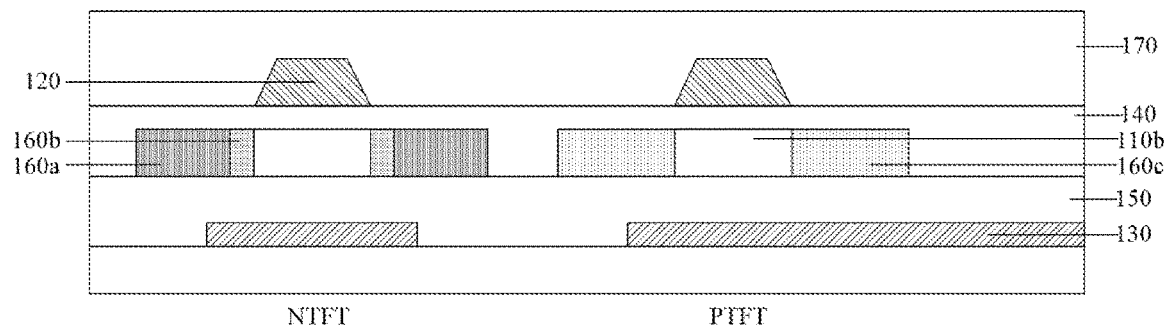
FIG. 11A to FIG. 11E are schematic structural diagrams of an array substrate in a fabrication process, respectively, according to an embodiment of the disclosure.

Firstly as illustrated in FIG. 11A, an entire layer of the interlayer insulation layer 170 is formed.

Figure 11B:
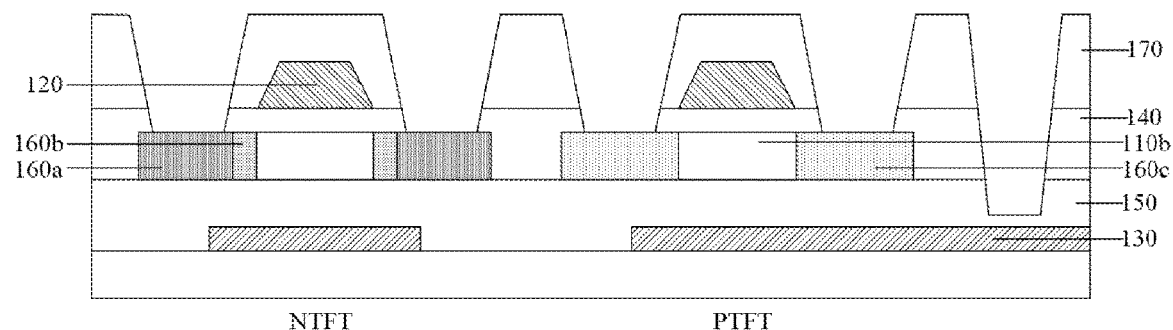

Thereafter as illustrated in FIG. 11B, the interlayer insulation layer 170 and the gate insulation layer 140 are dry-etched to form via holes, and a part of the buffer layer 150 is etched while the buffer layer 150 with the thickness of approximately 150nm remains.

Figure 11C:
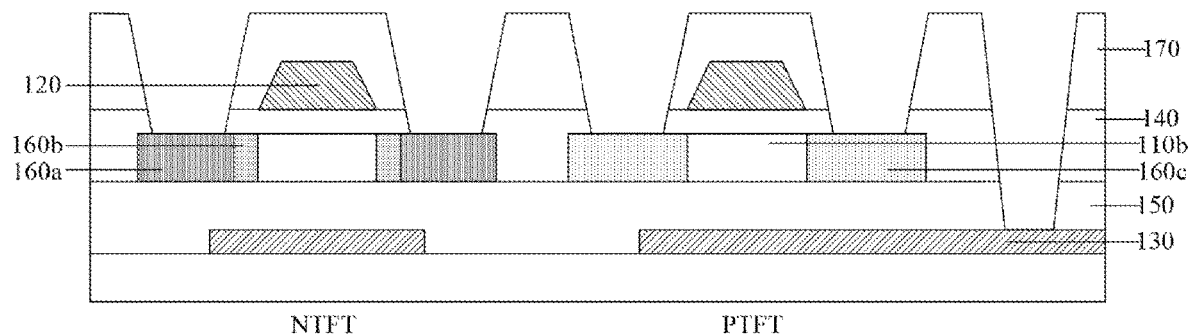

Then as illustrated in FIG. 11C, the remaining part of the buffer layer 150 is etched using Buffer Hydrofluoric Acid (BHF) to avoid the performance of the active layer 110 from being affected due to a dry etching process in which an exposed part of the active layer 110 might be etched.

Figure 11D:
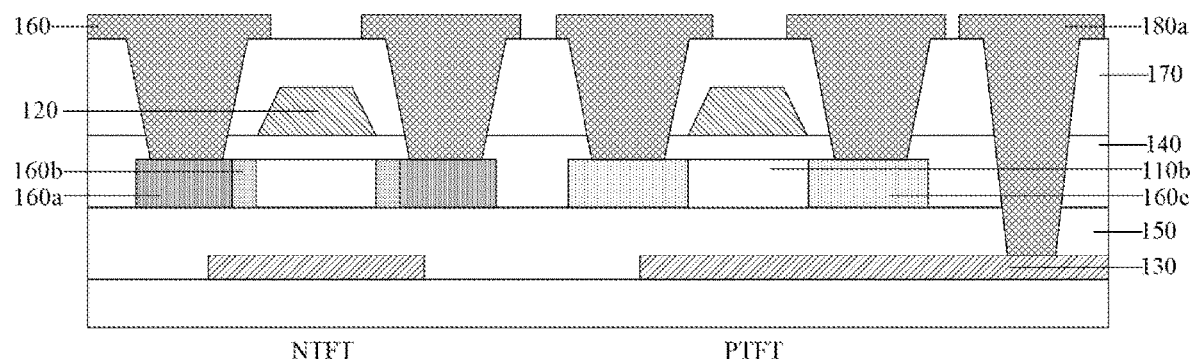

Lastly as illustrated in FIG. 11D, the source and drain electrodes 160, and the first signal wire 180a arranged at the same layer are formed.

Figure 10B:
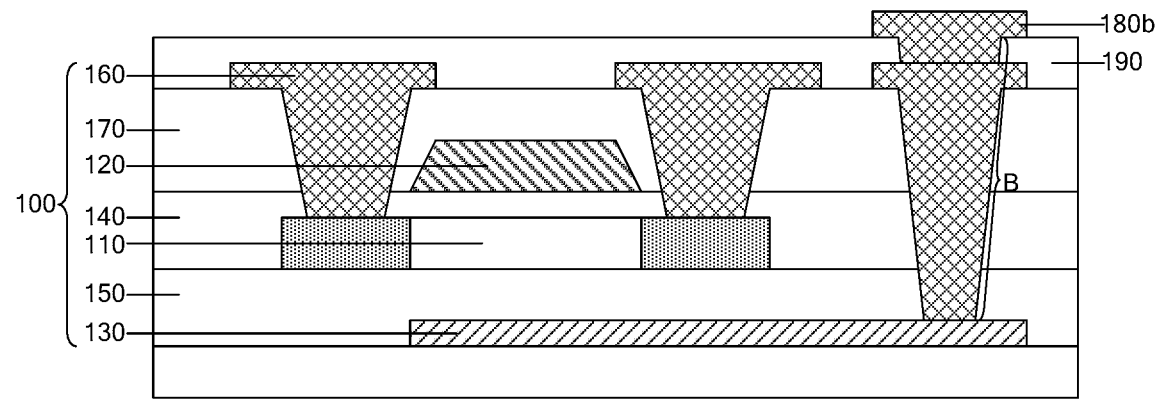

In one implementation, in the abovementioned array substrate according to the embodiment of the disclosure, FIG. 10B illustrates a second implementation of the signal wire, where the array substrate can include: a planarization layer 190 and a second signal wire 180b arranged on the thin film transistor 100 in that order, that is, the planarization layer 190 and the second signal wire 180b are arranged on the source and drain electrodes 160 of the thin film transistor 100 in that order, and the second signal wire 180b is arranged separately in a film layer, which is not used by any other film layer pattern; and then in order to connect the second signal wire 180b with the control electrode 130, the second signal wire 180b needs to be connected with the control electrode 130 through a second contact hole B running through the buffer layer 150, the gate insulation layer 140, the interlayer insulation layer 170, and the planarization layer 190.

In one embodiment, the second signal wire 180b can be fabricated as follows.

Firstly, after an entire layer of the interlayer insulation layer 170 is formed as illustrated in FIG. 11A, the interlayer insulation layer 170 and the gate insulation layer 140 are dry-etched to form via holes, and a part of the buffer layer 150 is etched while the buffer layer 150 with the thickness of approximately 150 nm remains, as illustrated in FIG. 11B; and thereafter the remaining part of the buffer layer 150 is etched using Buffer Hydrofluoric Acid (BHF) to avoid the performance of the active layer 110 from being affected due to a dry etching process in which an exposed part of the active layer 110 might be etched, as illustrated in FIG. 11C.

Figure 11E:
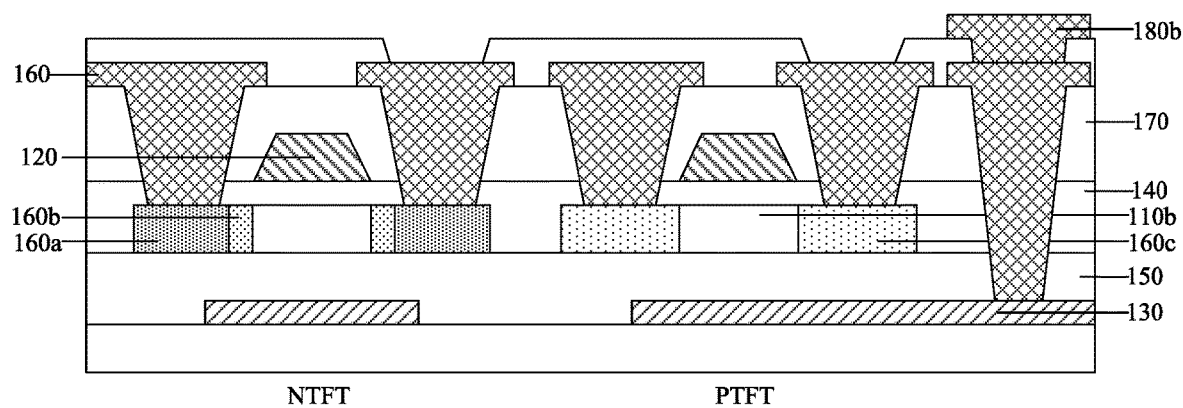

Then the source and drain electrodes 160 and a jointing electrode are formed as illustrated in FIG. 11E, thereafter the planarization layer 190 is formed, and the planarization layer 190 is dry-etched to form a via hole, and lastly the second signal wire 180b is formed to be connected with the control electrode 130 through the jointing electrode.

Figure 10C:
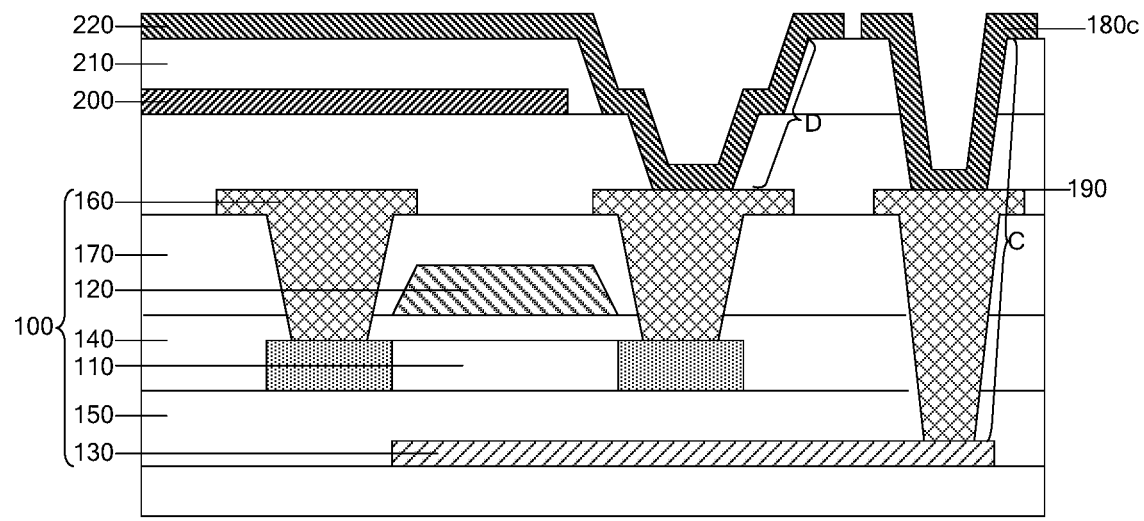

In one implementation, in the abovementioned array substrate according to the embodiment of the disclosure, FIG. 10C illustrates a third implementation of the signal wire, where the array substrate can include: a planarization layer 190, a first transparent electrode 200, a passivation layer 210, and a second transparent electrode 220 arranged on the thin film transistor 100 in that order, and a third signal wire 180c arranged at the same layer as the second transparent electrode 220, that is, the planarization layer 190, the first transparent electrode 200, the passivation layer 210, and the second transparent electrode 220 are arranged on the source and drain electrodes 160 of the thin film transistor 100 in that order, where the third signal wire 180c is arranged at the film layer where the second transparent electrode 220 is located. In order to avoid crosstalk between signals, the third signal wire 180c and the second transparent electrode 220 may be arranged separately, that is, they may not be connected; and then, in order to connect the third signal wire 180c with the control electrode 130, the third signal wire 180c needs to be connected with the control electrode 130 through a third contact hole C running through the buffer layer 150, the gate insulation layer 140, the interlayer insulation layer 170, the planarization layer 190, and the passivation layer 210.

In one embodiment, the third signal wire 180c can be fabricated as follows.

Firstly, after an entire layer of the interlayer insulation layer 170 is formed as illustrated in FIG. 11A, the interlayer insulation layer 170 and the gate insulation layer 140 are dry-etched to form via holes, and a part of the buffer layer 150 is etched while the buffer layer 150 with the thickness of approximately 150 nm remains, as illustrated in FIG. 11B; and thereafter the remaining part of the buffer layer 150 is etched using Buffer Hydrofluoric Acid (BHF) to avoid the performance of the active layer 110 from being affected due to a dry etching process in which an exposed part of the active layer 110 might be etched, as illustrated in FIG. 11C.

Then the source and drain electrodes 160 and a jointing electrode are formed, thereafter the planarization layer 190, the first transparent electrode 200, and the passivation layer 210 are formed, and lastly while the second transparent electrode 220 is being formed, the third signal wire 180c is formed to be connected with the control electrode 130 through the jointing electrode.

In one implementation, in the abovementioned array substrate according to the embodiment of the disclosure, as illustrated in FIG. 10C, the first transparent electrode 200 is typically a common electrode, and the second transparent electrode 220 is typically a pixel electrode; and then, the second transparent electrode 220 needs to be connected with the drain electrode of the source and drain electrodes 160 through a via hole D running through the planarization layer 190 and the passivation layer 210.

Figure 10D:
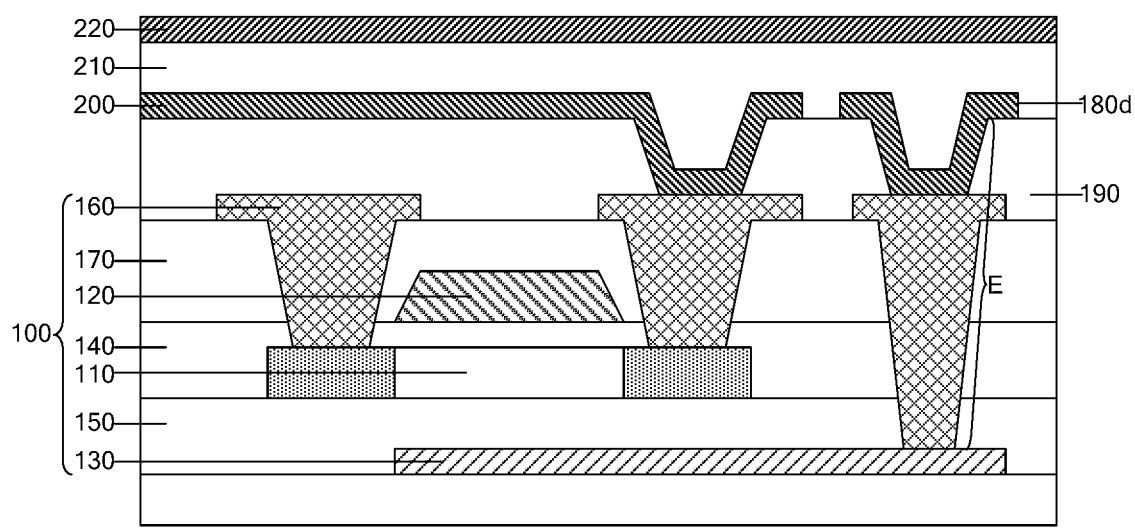

Alternatively in the abovementioned array substrate according to the embodiment of the disclosure, as illustrated in FIG. 10D, the first transparent electrode 200 may a pixel electrode, and accordingly the second transparent electrode 220 may be a common electrode; and then, a fourth signal wire 180d may be formed at the film layer where the first transparent electrode 200 is located. In order to avoid crosstalk between signals, the fourth signal wire 180d and the first transparent electrode 200 may be arranged separately, that is, they may not be connected; and then, in order to connect the fourth signal wire 180d with the control electrode 130, the fourth signal wire 180d needs to be connected with the control electrode 130 through a fourth contact hole E running through the buffer layer 150, the gate insulation layer 140, the interlayer insulation layer 170, and the planarization layer 190.

Based upon the same inventive conception, an embodiment of the disclosure further provides a method for driving an array substrate, applicable to driving the array substrate according to any one of the abovementioned embodiments of the disclosure. The method for driving the array substrate can be performed by applying the first control voltage to the control electrodes while the gate off voltage is being applied to the gate electrodes of the thin film transistors. Reference can be made to the embodiments of the abovementioned array substrate for one implementation of the driving method, so a repeated description thereof may be omitted here.

Figure 12:
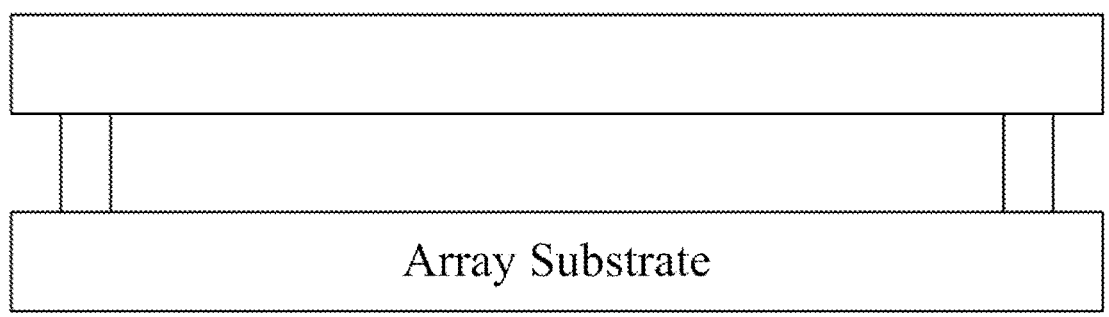
FIG. 12 is a schematic structural diagram of a display panel according to an embodiment of the disclosure.

Based upon the same inventive conception, an embodiment of the disclosure further provides a display panel as illustrated in FIG. 12, including the array substrate according to any one of the abovementioned embodiments of the disclosure, and the display panel can be any display panel including the array substrate, such as a liquid crystal display panel, an organic electroluminescent display panel or a plasma display panel. The display panel may be a rigid display panel or may be a flexible display panel, and FIG. 12 simply illustrates a rigid display panel, but the embodiment of the disclosure may not be limited thereto. Reference can be made to the embodiments of the abovementioned array substrate for an implementation of the display panel, so a repeated description thereof may be omitted here.

Figure 13:
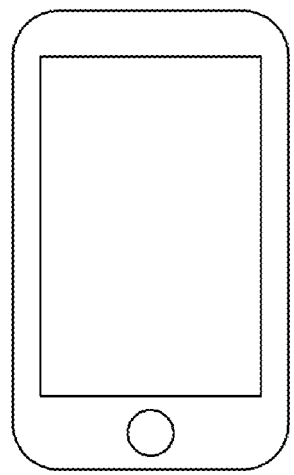
FIG. 13 is a schematic structural diagram of a display device according to an embodiment of the disclosure.

Based upon the same inventive conception, an embodiment of the disclosure further provides a display device as illustrated in FIG. 13, including the display panel according to any one of the abovementioned embodiments of the disclosure, where the display device can be any product or component capable of displaying, such as a mobile phone, a tablet computer, a TV, a display, a notebook computer, a digital photo frame, or a navigator. Reference can be made to the embodiments of the abovementioned display panel for an implementation of the display device, so a repeated description thereof may be omitted here.

In the array substrate, the method for driving the same, the display panel, and the display device according to the embodiments of the disclosure, the control electrode is arranged on the side of the active layer of the thin film transistor away from the gate electrode, and the thickness of the buffer layer between the control electrode and the active layer is controlled so that the buffer layer is thicker than the gate insulation layer between the gate electrode and the active layer, to adjust the distance between the control electrode and the active layer to be larger than the distance between the gate electrode and the active layer; and at least when the gate off voltage is applied to the gate electrode so that the thin film transistor is switched off, the first control voltage is applied to the control electrode to vary the voltage Vg of the thin film transistor so as to vary the threshold voltage Vth of the thin film transistor so that an Id-Vg curve of the thin film transistor is shifted to ensure a small leakage current Id when the thin film transistor is switched off, for the effect of stabilizing the circuit and lowering power consumption thereof.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A display panel, comprising:
   at least one first thin film transistor that included in a plurality of pixel control transistors arranged in a display area, and N-type transistors and P-type transistors arranged in a driver circuit in a non-display area;
   wherein the first thin film transistor comprises an active layer, a gate electrode, a control electrode, a gate insulation layer arranged between the gate electrode and the active layer, and a buffer layer arranged between the control electrode and the active layer;
   wherein the buffer layer is thicker than the gate insulation layer;
   wherein the control electrode is configured to vary a threshold voltage of the first thin film transistor, via a first control voltage applied to the control electrode at least when a gate off voltage is applied to the gate electrode; and
   wherein the first thin film transistor is top-gate thin film transistor, and further comprises: source and drain electrodes, and an interlayer insulation layer arranged between the source and drain electrodes and the sate electrode., a first signal wire arranged at the same layer as the source and drain electrodes: and the first signal wire is connected with the control electrode through a first contact hole running through the buffer layer, the gate insulation layer, and the interlayer insulation layer.

2. The display panel according to claim 1, wherein the control electrode is further configured to vary the threshold voltage of the first thin film transistor, via the first control voltage which is the same as the second control voltage.

3. The display panel according to claim 2, wherein when the first film transistor is N-type thin film transistor, the control electrode is further configured to vary the threshold voltage of the first thin film transistor, via the first control voltage ranging from -1.5V to 0V, with -1.5 V and 0V included.

4. The display panel according to claim 2, wherein when the first thin film transistor is P-type thin film transistor, the control electrode is further configured to vary the threshold voltage of the first thin film transistor, via the first control voltage ranging from 0V to 1.5V, with 0V and 1.5V included.

5. The display panel according to claim 1, wherein the pixel control transistors are N-type transistors, and when the gate off voltage is applied to gate electrodes of the pixel control transistors, the pixel control transistors are configured to be applied with a first control voltage which is the same as the first control voltage applied to the N-type transistors in the driver circuit when the gate off voltage is applied to the gate electrodes of the N-type transistors in the driver circuit.

6. The display panel according to claim 5, wherein the pixel control transistors are configured to be applied with a second control voltage which is 0V when the gate on voltage is applied to the gate electrodes of the pixel control transistors, and the N-type transistors in the driver circuit are configured to be applied with a second control voltage which is -1.5V when the gate on voltage is applied to the gate electrodes of the N-type transistors in the driver circuit.

7. The display panel according to claim 1, wherein the control electrode is further configured to vary the threshold voltage of the first thin film transistor, via a second control voltage applied to the control electrode when a gate on voltage is applied to the gate electrode.

8. The display panel according to claim 7, wherein the control electrode is further configured to vary the threshold voltage of the first thin film transistor, via the first control voltage lying between the gate on voltage and the gate off voltage.

9. The display panel according to claim 7, wherein the control electrode is further configured to vary the threshold voltage of the first thin film transistor, via the second control voltage lying between the gate on voltage and the gate off voltage.

10. A display device, comprising the display panel according to claim 1, wherein the display panel comprises
    at least one first thin film transistor that included in a plurality of pixel control transistors arranged in a display area, and N-type transistors and P-type transistors arranged in a driver circuit in a non-display area;
    wherein the first thin film transistor comprises an active layer, a gate electrode, a control electrode, a gate insulation layer arranged between the gate electrode and the active layer, and a buffer layer arranged between the control electrode and the active layer;
    wherein the buffer layer is thicker than the gate insulation layer;
    wherein the control electrode is configured to vary a threshold voltage of the first thin film transistor, via a first control voltage applied to the control electrode at least when a gate off voltage is applied to the gate electrode;
    wherein the first thin film transistor is top-gate thin film transistor, and further comprises: source and drain electrodes an interlayer insulation layer arranged between the source and drain electrodes and the gate electrode, and a first signal wire arranged at the same layer as the source and drain electrodes; and the first siunal wire is connected with the control electrode through a first contact hole running through the buffer layer, the gate insulation layer, and the interlayer insulation layer.

11. A method for driving a display panel, applicable to driving the display panel according to claim 1, wherein the display panel comprises at least one first thin film transistor that included in a plurality of pixel control transistors arranged in a display area, and N-type transistors and P-type transistors arranged in a driver circuit in a non-display area;
    wherein the first thin film transistor comprises an active layer, a gate electrode, a control electrode, a gate insulation layer arranged between the gate electrode and the active layer, and a buffer layer arranged between the control electrode and the active layer;
    wherein, the buffer layer is thicker than the gate insulation layer;
    wherein a first control voltage is applied to the control electrode at least when a gate off voltage is applied to the gate electrode;
    wherein the first thin film transistor is top-gate thin film transistor, and further comprises: source and drain electrodes, an interlayer insulation layer arranged between the source and drain electrodes and the gate electrode, and a first signal wire arranged at the same layer as the source and drain electrodes; and the first signal wire is connected with the control electrode through a first contact hole running through the buffer layer, the gate insulation layer, and the interlayer insulation layer, the method comprising:

applying the first control voltage to the control electrode while the gate off voltage is being applied to the gate electrode of the first thin film transistor.

12. A display panel comprising;
at least one first thin film transistor that included in a plurality of pixel control transistors arranged in a display area, and N-type transistors and P-type transistors arranged in a driver circuit in a non-display area;
wherein the first thin film transistor comprises an active layer, a gate electrode, a control electrode, a gate insulation layer arranged between the gate electrode and the active layer, and a buffer layer arranged between the control electrode and the active layer;
wherein the buffer layer is thicker than the gate insulation layer;
wherein the control electrode is configured to vary a threshold voltage of the first thin film transistor, via a first control voltage applied to the control electrode at least when a gate off voltage is applied to the gate electrode;
wherein the first thin film transistor is top-gate thin film transistor, and further comprises: source and drain electrodes, an interlayer insulation layer arranged between the source and drain electrodes and the gate electrode, and a planarization layer, and a second signal wire arranged on the first thin film transistors in that order; and the second signal wire is connected with the control electrode through a second contact hole running through the buffer layer, the gate insulation layer, the interlayer insulation layer, and the planarization layer.

13. A display device, comprising the display panel according to claim 12, wherein the display panel comprises at least one first thin film transistor that included in a plurality of pixel control transistors arranged in a display area, and N-type transistors and P-type transistors arranged in a driver circuit in a non-display area;
wherein the first thin film transistor comprises an active layer, a gate electrode, a control electrode, a gate insulation layer arranged between the gate electrode and the active layer, and a buffer layer arranged between the control electrode and the active layer;
wherein the buffer layer is thicker than the gate insulation layer;
wherein the control electrode is configured to vary a threshold voltage of the first thin film transistor, via a first control voltage applied to the control electrode at least when a gate off voltage is applied to the gate electrode;
wherein the first thin film transistor is top-gate thin film transistor, and further comprises: source and drain electrodes, an interlayer insulation layer arranged between the source and drain electrodes and the gate electrode, and a planarization layer, and a second signal wire arranged on the first thin film transistors in that order; and the second signal wire is connected with the control electrode through a second contact hole running through the buffer layer, the gate insulation layer, the interlayer insulation layer, and the planarization layer.

14. A display panel, comprising:
at least one first thin film transistor that included in a plurality of pixel control transistors arranged in a display area, and N-type transistors and P-type transistors arranged in a driver circuit in a non-display area;
wherein the first thin film transistor comprises an active layer, a gate electrode, a control electrode, a gate insulation layer arranged between the gate electrode and the active layer, and a buffer layer arranged between the control electrode and the active layer;
wherein the buffer layer is thicker than the gate insulation layer;
wherein the control electrode is configured to vary a threshold voltage of the first thin film transistor, via a first control voltage applied to the control electrode at least when a gate off voltage is applied to the gate electrode;
wherein the first thin film transistor is top-gate thin film transistor, and further comprises; source and drain electrodes, an interlayer insulation layer arranged between the source and drain electrodes and the gate electrode, and a planarization layer, a first transparent electrode, a passivation layer, and a second transparent electrode arranged on the first thin film transistors in that order, and a third signal wire arranged at the same layer as the second transparent electrode; and the third signal wire is connected with the control electrode through a third contact hole running through the buffer layer, the gate insulation layer, the interlayer insulation layer, the planarization layer, and the passivation layer.

15. A display device, comprising the display panel according to claim 14, wherein the display panel comprises at least one first thin film transistor that included in a plurality of pixel control transistors arranged in a display area, and N-type transistors and P-type transistors arranged in a driver circuit in a non-display area;
wherein the first thin film transistor comprises an active layer, a gate electrode, a control electrode, a gate insulation layer arranged between the gate electrode and the active layer, and a buffer layer arranged between the control electrode and the active layer;
wherein the buffer layer is thicker than the gate insulation layer;
wherein the control electrode is configured to vary a threshold voltage of the first thin film transistor, via a first control voltage applied to the control electrode at least when a gate off voltage is applied to the gate electrode;
wherein the first thin film transistor is top-gate thin film transistor, and further comprises: source and drain electrodes, an interlayer insulation layer arranged between the source and drain electrodes and the gate electrode, and a planarization layer, a first transparent electrode, a passivation layer, and a second transparent electrode arranged on the first thin film transistors in that order, and a third signal wire arranged at the same layer as the second transparent electrode; and the third signal wire is connected with the control electrode through a third contact hole running through the buffer layer, the gate insulation layer, the interlayer insulation layer, the planarization layer, and the passivation layer.

* * * * *